United States Patent
Sutherland et al.

(10) Patent No.: US 7,216,316 B1
(45) Date of Patent: May 8, 2007

(54) METHOD FOR EVALUATING NETS IN CROSSTALK NOISE ANALYSIS

(75) Inventors: Jeannette N. Sutherland, Cedar Park, TX (US); Robert E. Mains, Morgan Hill, CA (US); Matthew J. Amatangelo, Austin, TX (US); Shervin Hojat, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 460 days.

(21) Appl. No.: 10/794,756

(22) Filed: Mar. 5, 2004

(51) Int. Cl.
*G06F 17/50* (2006.01)
(52) U.S. Cl. .............................. 716/6; 716/5
(58) Field of Classification Search ................ 716/5–6
See application file for complete search history.

(56) References Cited

U.S. PATENT DOCUMENTS

| | | | | |
|---|---|---|---|---|
| 6,389,581 | B1 * | 5/2002 | Muddu et al. ................. | 716/6 |
| 6,532,574 | B1 * | 3/2003 | Durham et al. ................ | 716/6 |
| 6,587,815 | B1 * | 7/2003 | Aingaran et al. ............. | 703/13 |
| 6,826,736 | B2 * | 11/2004 | Wu et al. ....................... | 716/5 |
| 6,940,293 | B2 * | 9/2005 | Ramarao et al. ............. | 324/677 |
| 6,948,142 | B2 * | 9/2005 | Tetelbaum et al. ............ | 716/6 |

OTHER PUBLICATIONS

Thudi et al., "Non-Iterative Switching Window Computation for Delay-Noise," ACM, Jun. 2-6, 2003, pp. 390-395.*

Zhou et al., "Timing Verification with Crosstalk for Transparently Latched Circuits," IEEE, 2003, pp. 1-6.*

Thudi et al. "Efficient Switching Window Computations for Cross-Talk Noise," ACM, Dec. 2-3, 2002, pp. 84-91.*

Agarwal et al., "Efficient Geneation of Delay Change Curves for Noise-Aware Static Timing Analysis," IEEE, Jan. 2002, pp. 1-8.*

Byron Krauter and David Widiger Variable Frequency Crosstalk Noise Analysis: A Methodology to Guarantee Functionality from dc to fmax, Annual ACM IEEE Design Automation Conference, Proceedings of the 39th conference on Design automation, New Orleans, Louisiana, USA, pp. 665-668, Year of Publication: 2002, ISBN-ISSN:0738-100X, 1-58113-461-4.

* cited by examiner

*Primary Examiner*—Vuthe Siek
(74) *Attorney, Agent, or Firm*—Martine Penilla & Gencarella, LLP (57) ABSTRACT

Broadly speaking, a method is provided for evaluating nets in a crosstalk noise analysis. More specifically, a method is provided for evaluating timing window overlap between a pair of nets. The method includes selecting one timing window from each net of the pair of nets for analysis. The method further includes analyzing characteristics of the timing windows selected from the pair of nets to identify a timing window overlap presence, wherein the timing window overlap presence can exist between any two timing windows associated with each net of the pair of nets, respectively.

17 Claims, 7 Drawing Sheets

METHOD FOR EVALUATING NETS IN CROSSTALK NOISE ANALYSIS

BACKGROUND OF THE INVENTION

1. Field of the Invention

The present invention relates generally to integrated circuit design, and more specifically to evaluation of nets in crosstalk noise analysis.

2. Description of the Related Art

In modern integrated circuit design, separation between conductor lines ("lines") is optimized to most efficiently utilize chip area. This optimization often results in closely spaced lines that are susceptible to capacitive coupling. In some instances, capacitive coupling between lines can lead to an adverse crosstalk noise condition. In a crosstalk noise scenario, there is an aggressor net and a victim net. The aggressor net is characterized as having a signal that negatively impacts a signal on the victim net. The adverse crosstalk noise condition may occur when both the aggressor net and the victim net are simultaneously active.

Potential aggressors may be identifiable based on circuit layout, but without further analysis it is not possible to determine whether the potential aggressor nets represent a problem, i.e., whether the potential aggressor nets are active simultaneously with respect to the victim nets. In a typical circuit, there can be hundreds of potential aggressor nets. Additionally, since the circuit design process is iterative by nature, a set of potential aggressor may change during different iterations of the circuit design process.

In view of the foregoing, a method is needed for efficiently identifying potentially problematic aggressor nets.

SUMMARY OF THE INVENTION

Broadly speaking, the present invention provides a method for evaluating nets in a crosstalk noise analysis. More specifically, the present invention provides a method for evaluating timing window overlap between a pair of nets. The method includes selecting one timing window from each net of the pair of nets for analysis. The method further includes analyzing characteristics of the timing windows selected from the pair of nets to identify a timing window overlap presence, wherein the timing window overlap presence can exist between any two timing windows associated with each net of the pair of nets, respectively.

In one embodiment, a method for evaluating nets in a crosstalk noise analysis is disclosed. The method includes selecting one timing window from a first net, wherein the first net includes a plurality of timing windows. The method also includes selecting one timing window from a second net, wherein the second net includes a plurality of timing windows. The method further includes analyzing characteristics of the one timing window from the first net and the one timing window from the second net to identify a timing window overlap presence. The timing window overlap presence can exist between any of the plurality of timing windows associated with the first net and any of the plurality of timing windows associated with the second net.

In another embodiment, a computer readable media containing program instructions for evaluating nets in a crosstalk noise analysis is disclosed. The computer readable media includes program instructions for selecting one timing window from a first net, wherein the first net includes a plurality of timing windows. The computer readable media also includes program instructions for selecting one timing window from a second net, wherein the second net includes a plurality of timing windows. The computer readable media further includes program instructions for analyzing characteristics of the one timing window from the first net and the one timing window from the second net to identify a timing window overlap presence. The timing window overlap presence can exist between any of the plurality of timing windows associated with the first net and any of the plurality of timing windows associated with the second net.

In yet another embodiment, a method for evaluating timing window overlap between a pair of nets is disclosed. The method includes selecting one timing window from a first net and one timing window from a second net, wherein the selected timing window from the second net occurs at about a same time or at a later time relative to the selected timing window from the first net. The method also includes analyzing the selected timing windows from the first net and the second net to identify a presence of a timing window overlap. The timing window overlap can exist between any timing window of the first net occurring at about a same time or at a later time relative to a particular timing window of the second net, wherein the particular timing window of the second net can be any timing window of the second net.

In yet another embodiment, a method for evaluating timing window overlap between a pair of nets is disclosed. The method includes selecting one timing window from a first net and selecting one timing window from a second net, wherein the selected timing window from the second net occurs prior in time to the selected timing window from the first net. The method also includes analyzing the selected timing windows from the first net and the second net to identify a presence of a timing window overlap. The timing window overlap can exist between any timing window of the first net occurring later in time than a particular timing window of the second net, wherein the particular timing window of the second net can be any timing window of the second net.

Other aspects of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION

Broadly speaking, the present invention provides a method for evaluating nets in a crosstalk noise analysis. More specifically, the present invention provides a method for evaluating timing window overlap between a pair of nets. The method includes selecting one timing window from each net of the pair of nets for analysis. The method further includes analyzing characteristics of the timing windows selected from the pair of nets to identify a timing window overlap presence, wherein the timing window overlap presence can exist between any two timing windows associated with each net of the pair of nets, respectively.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

It should be appreciated that the present invention can be implemented in numerous ways, including as a process, an apparatus, a system, a device, or a method. Several exemplary embodiments of the invention will now be described in detail with reference to the accompanying drawings.

Figure 1:
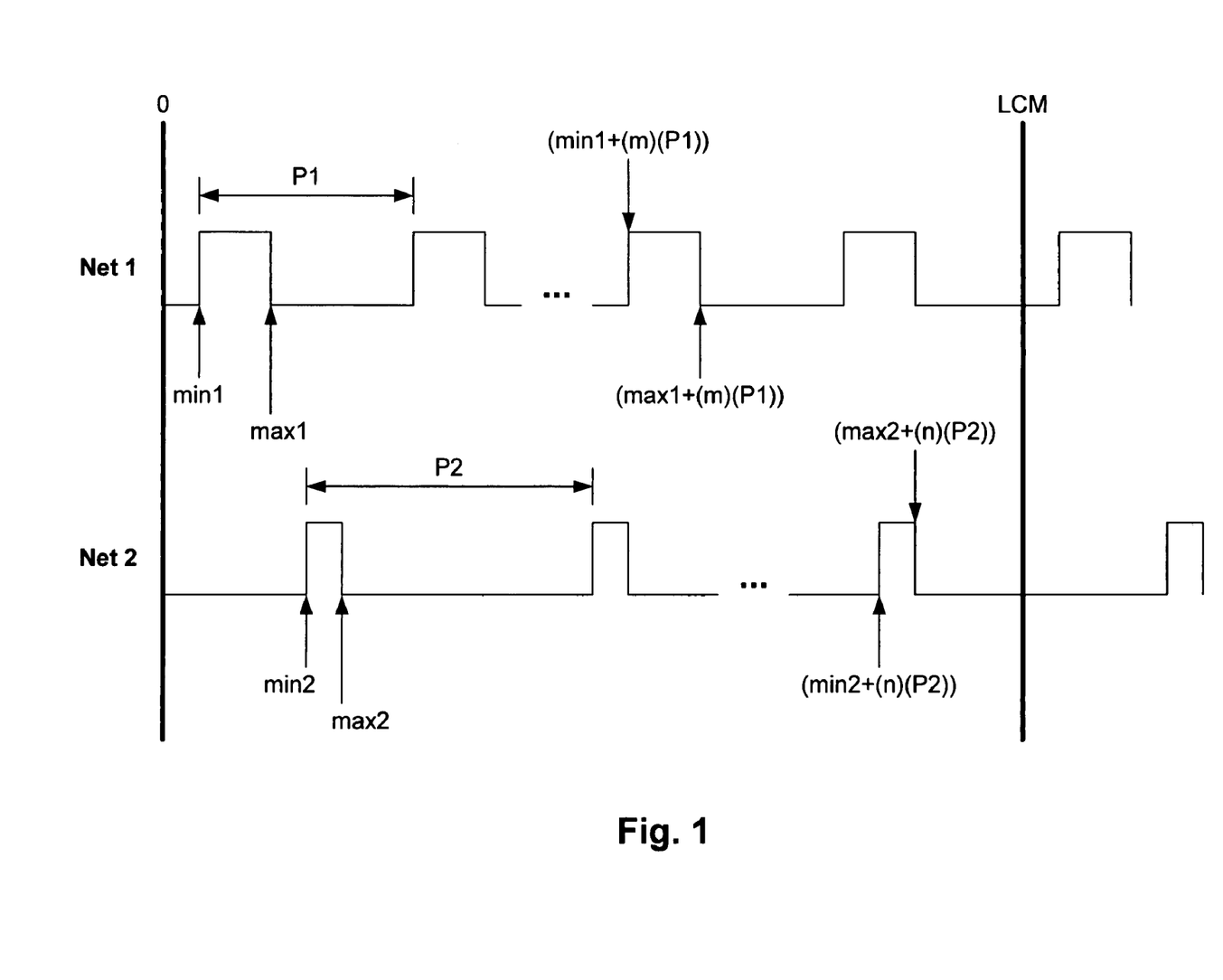
FIG. 1 is an illustration showing a timing window sequence of a first net relative to a timing window sequence of a second net, in accordance with one embodiment of the present invention.

FIG. 1 is an illustration showing a timing window sequence of a first net (Net 1) relative to a timing window sequence of a second net (Net 2), in accordance with one embodiment of the present invention. The timing window sequences of the first net (Net 1) and the second net (Net 2) are defined to start at an initial instance in time represented as 0. With respect to the first net (Net 1), the timing window sequence is defined by a timing window extending from a leading edge (min1) to a trailing edge (max1) and having a period (P1). Thus, the timing window (min1 to max1) occurs at each integer multiple of the period (P1) as indicated by the arbitrary timing window identified as occurring between (min1+(m)(P1)) and (max1+(m)(P1)), wherein (m) is an integer value. With respect to the second net (Net 2) the timing window sequence is defined by a timing window extending from a leading edge (min2) to a trailing edge (max2) and having a period of P2. Thus, the timing window (min2 to max2) occurs at each integer multiple of the period (P2) as indicated by the arbitrary timing window identified as occurring between (min2+(n)(P2)) and (max2+(n)(P2)), wherein (n) is an integer value. Also, since each of the timing window sequences of the first net (Net 1) and the second (Net 2) begins at a common instance in time and maintains a steady period, a relationship between the timing window sequences of the first net (Net 1) and the second net (Net 2) will periodically repeat in accordance with a least common multiple (LCM) of the periods (P1) and (P2).

In the present context, a timing window can be defined as a range in time that bounds an instance in time at which a signal associated with the respective net is to be utilized. Considering the timing window of the first net (Net 1), a range in time extending from the leading edge (min1) to the trailing edge (max1) bounds an instance in time at which a signal associated with the first net (Net 1) is to be utilized. For example, if a particular portion of the first net (Net 1) under consideration is expected to respond to a falling edge of a signal, the leading edge of the timing window (min1) can represent the earliest instance in time at which the signal will have a falling edge, and the trailing edge of the timing window (max1) can represent the latest instance in time at which the signal will have a falling edge. Therefore, in the present example, each timing window in the timing window sequence of the first net (Net 1) represents a period during which the signal of the first net (Net 1) is expected to have a falling edge.

Also, considering the timing window of the second net (Net 2), a range in time extending from the leading edge (min2) to the trailing edge (max2) bounds an instance in time at which a signal associated with the second net (Net 2) is to be utilized. For example, if a particular portion of the second net (Net 2) under consideration is expected to respond to a rising edge of a signal, the leading edge of the timing window (min2) can represent the earliest instance in time at which the signal will have a rising edge, and the trailing edge of the timing window (max2) can represent the latest instance in time at which the signal will have a rising edge. Therefore, in the present example, each timing window in the timing window sequence of the second net (Net 2) represents a period during which the signal of the second net (Net 2) is expected to have a rising edge.

In the present example, the first net (Net 1) and the second net (Net 2) may be defined in a manner that warrants evaluation in a crosstalk noise analysis. For instance, it is conceivable that the first net (Net 1) and the second net (Net 2) are defined such that a coupling of their respective signals may occur. Thus, if a timing window of the first net (Net 1) were to overlap a timing window of the second net (Net 2), it would be possible for the falling edge of the first net (Net 1) signal to be adversely influenced by the rising edge of the second net (Net 2) signal. Such an adverse influencing of signals between two nets is referred to as crosstalk noise. Additionally, each of the two nets is referred to in a complementary manner as either an aggressor net or a victim net, wherein the signal of the victim net is adversely influenced by the signal of the aggressor net.

Timing window sequences associated with a pair of nets can be evaluated in a crosstalk noise analysis to identify potential adverse crosstalk noise conditions between the nets. The present invention provides an efficient method for performing a crosstalk noise analysis on a pair of nets to identify a timing window overlap presence between the pair of nets, wherein the timing window overlap presence can represent a potential adverse crosstalk noise condition. Also, the method of the present invention can be implemented with limited knowledge regarding the timing window sequences of each net. More specifically, one timing window from each net and the timing window sequence period of each net is used to implement the present invention.

Tables 1 and 2, in conjunction with FIG. 1, provide a general representation of the method of the present invention for performing crosstalk noise analysis on a pair of nets to identify a timing window overlap presence between the nets. The method includes recognition of each net specification with respect to its timing window sequence. As shown in Tables 1 and 2 and FIG. 1, the timing window sequence of Net 1 is defined by a reference timing window extending from the leading edge (min1) to the trailing edge (max1) and occurring with a period of (P1). Also, the timing window sequence of Net 2 is defined by a reference timing window extending from the leading edge (min2) to the trailing edge (max2) and occurring with a period of (P2). A greatest common divisor of the Net 1 period (P1) and the Net 2 period (P2) is represented as GCD. It should be appreciated by those skilled in the art that the GCD can be determined using a number of methods. For example, in one embodiment, the GCD is determined by dividing a product of the Net 1 period (P1) and the Net 2 period (P2) by a least common multiple (LCM) of the Net 1 period (P1) and the Net 2 period (P2), [GCD=(P1*P2)/LCM].

The method of the present invention for performing crosstalk noise analysis is defined by a forward analysis and a reverse analysis. In the forward analysis, one timing window from Net 1 and one timing window from Net 2 are considered, wherein the one timing window from Net 1 occurs at least as early in time as the one timing window from Net 2. Thus, in the forward analysis, the one timing window from Net 1 can occur at an instance in time before or even with the one timing window from Net 2. The forward analysis method serves to identify a timing window overlap presence between any two timing windows from Net 1 and Net 2, respectively, wherein the timing window from Net 1 occurs at least as early in time as the timing window from Net 2. In a complementary manner, the reverse analysis considers one timing window from Net 1 and one timing window from Net 2, wherein the one timing window from Net 1 occurs later in time relative to the one timing window from Net 2. Thus, in the reverse analysis, the one timing window from Net 1 can occur at an instance in time after the one timing window from Net 2. The reverse analysis method serves to identify a timing window overlap presence between any two timing windows from Net 1 and Net 2, respectively, wherein the timing window from Net 1 occurs later in time relative to the timing window from Net 2.

With respect to both the forward analysis and the reverse analysis, an instance in time at which a timing window occurs can be defined by either the leading edge or the trailing edge of the timing window, so long as the instance in time at which the timing window occurs is defined in the same manner for each of Net 1 and Net 2. In other words, the method of the present invention can include one or more of a forward analysis based on use of timing window leading edges, a reverse analysis based on use of timing window leading edges, a forward analysis based on use of timing window trailing edges, and a reverse analysis based on use of timing window trailing edges. Table 1 provides a general representation of the forward analysis and the reverse analysis based on use of timing window leading edges. Table 2 provides a general representation of the forward analysis and the reverse analysis based on use of timing window trailing edges.

With respect to Tables 1 and 2, the forward analysis based on use of either timing window leading edges or timing window trailing edges includes an operation for selecting one comparative timing window from each of Net 1 and Net 2. The one comparative timing window from Net 1 is represented as [N1LE,N1TE], wherein N1LE refers to the corresponding leading edge time value and N1TE refers to the corresponding trailing edge time value. With respect to FIG. 1, the one comparative timing window from Net 1 can be arbitrarily selected such that N1LE=(min1+(m)(P1)) and N1TE=(max1+(m)(P1)), where (m) is an integer value. The one comparative timing window from Net 2 is represented as [N2LE,N2TE], wherein N2LE refers to the corresponding leading edge time value and N2TE refers to the corresponding trailing edge time value. With respect to FIG. 1, the one comparative timing window from Net 2 can be selected such that N2LE=(min2+(n)(P2)) and N2TE=(max2+(n)(P2)), where (n) is an integer value. However, as previously mentioned, the comparative timing window from Net 1 should occur at least as early in time as the comparative timing window from Net 2. Therefore, the forward analysis using leading edges requires that N1LE be less than or equal to N2LE, and the forward analysis using trailing edges requires that N1TE be less than or equal to N2TE.

With respect to Tables 1 and 2, the forward analysis based on use of either timing window leading edges or timing window trailing edges includes another operation for analyzing characteristics of the comparative timing windows selected from Net 1 and Net 2 to identify a timing window overlap presence. Analyzing characteristics of the comparative timing windows includes a first operation in which a minimum separation analysis is performed. The minimum separation analysis includes determining an offset between the comparative timing windows from Net 1 and Net 2. In the forward analysis based on use of timing window leading edges, the offset is defined as a difference between the leading edge time value of the Net 2 comparative timing window and the leading edge time value of the Net 1 comparative timing window, (i.e., N2LE−N1LE). For discussion purposes the offset (N2LE−N1LE) is referred to as a forward analysis leading edge offset or (FLEOS). Similarly, in the forward analysis based on use of timing window trailing edges, the offset is defined as a difference between the trailing edge time value of the Net 2 comparative timing window and the trailing edge time value of the Net 1 comparative timing window, (i.e., N2TE−N1TE). For discussion purposes the offset (N2TE−N1TE) is referred to as a forward analysis trailing edge offset or (FTEOS).

The minimum separation analysis further includes determining a minimum separation between any timing window from Net 1 and any timing window from Net 2, wherein the timing window from Net 1 occurs at least as early as the timing window from Net 2. The minimum separation is defined as a remainder of an integer division of the offset between the comparative timing windows from Net 1 and Net 2 by the GCD of the Net 1 and Net 2 timing window sequence periods (P1) and (P2), (i.e., ("offset" % GCD), where % represents a modulo operation). In the forward analysis based on use of timing window leading edges, the minimum separation is defined as (FLEOS % GCD). For discussion purposes (FLEOS % GCD) is referred to as a forward analysis leading edge minimum separation or (FLEMS). In the forward analysis based on use of timing window trailing edges, the minimum separation is defined as (FTEOS % GCD). For discussion purposes (FTEOS % GCD) is referred to as a forward analysis trailing edge minimum separation or (FTEMS).

Analyzing characteristics of the comparative timing windows selected from Net 1 and Net 2 to identify a timing window overlap presence includes another operation for performing a timing window overlap determination. In the forward analysis based on use of timing window leading edges, the timing window overlap determination includes comparing a duration (i.e., width) of the comparative timing window from Net 1 (i.e., N1TE−N1LE) to the minimum separation (FLEMS). If (N1TE−N1LE) is greater than or equal to (FLEMS), an overlap condition exists. Otherwise, an overlap condition does not exist. Similarly, in the forward analysis based on use of timing window trailing edges, the timing window overlap determination includes comparing a duration (i.e., width) of the comparative timing window from Net 2 (i.e., N2TE−N2LE) to the minimum separation (FTEMS). If (N2TE−N2LE) is greater than or equal to (FTEMS), an overlap condition exists. Otherwise, an overlap condition does not exist. As previously mentioned, the presence of an overlap condition may be indicative of an adverse crosstalk noise condition. Therefore, if an overlap condition is present, the two nets under consideration may be flagged for further evaluation and possible modification.

With respect to Tables 1 and 2, the reverse analysis based on use of either timing window leading edges or timing window trailing edges includes an operation for selecting one comparative timing window from each of Net 1 and Net 2. The comparative timing windows from each of Net 1 [N1LE,N1TE] and Net 2 [N2LE,N2TE] are selected in the same manner as previously described with respect to the forward analysis. However, as previously mentioned, the comparative timing window from Net 1 [N1LE,N1TE] should occur later in time with respect to the comparative timing window from Net 2 [N2LE,N2TE]. Therefore, the reverse analysis using leading edges requires that N1LE be greater than N2LE, and the reverse analysis using trailing edges requires that N1TE be greater than N2TE.

With respect to Tables 1 and 2, the reverse analysis based on use of either leading edges or trailing edges includes another operation for analyzing characteristics of the comparative timing windows selected from Net 1 and Net 2 to identify a timing window overlap presence. Analyzing characteristics of the comparative timing windows includes a first operation in which a minimum separation analysis is performed. The minimum separation analysis includes determining an offset between the comparative timing windows from Net 1 and Net 2. In the reverse analysis using timing window leading edges, the offset is defined as a difference between the leading edge time value of the Net 1 comparative timing window and the leading edge time value of the Net 2 comparative timing window, (i.e., N1LE−N2LE). For discussion purposes the offset (N1LE−N2LE) is referred to as a reverse analysis leading edge offset or (RLEOS). Similarly, in the reverse analysis based on use of timing window trailing edges, the offset is defined as a difference between the trailing edge time value of the Net 1 comparative timing window and the trailing edge time value of the Net 2 comparative timing window, (i.e., N1TE−N2TE). For discussion purposes the offset (N1TE−N2TE) is referred to as a reverse analysis trailing edge offset or (RTEOS).

The minimum separation analysis further includes determining a minimum separation between any timing window from Net 1 and any timing window from Net 2, wherein the timing window from Net 1 occurs later in time with respect to the timing window from Net 2. The minimum separation is defined as a remainder of an integer division of the offset between the comparative timing windows from Net 1 and Net 2 by the GCD of the Net 1 and Net 2 timing window sequence periods (P1) and (P2), (i.e., ("offset" % GCD), where % represents a modulo operation). In the reverse analysis based on use of timing window leading edges, the minimum separation is defined as (RLEOS % GCD). For discussion purposes (RLEOS % GCD) is referred to as a reverse analysis leading edge minimum separation or (RLEMS). In the reverse analysis based on use of timing window trailing edges, the minimum separation is defined as (RTEOS % GCD). For discussion purposes (RTEOS % GCD) is referred to as a reverse analysis trailing edge minimum separation or (RTEMS).

Analyzing characteristics of the comparative timing windows selected from Net 1 and Net 2 to identify a timing window overlap presence includes another operation for performing a timing window overlap determination. In the reverse analysis based on use of timing window leading edges, the timing window overlap determination includes comparing a duration (i.e., width) of the comparative timing window from Net 2 (i.e., N2TE−N2LE) to the minimum separation (RLEMS). If (N2TE−N2LE) is greater than or equal to (RLEMS), an overlap condition exists. Otherwise, an overlap condition does not exist. Similarly, in the reverse analysis based on use of timing window trailing edges, the timing window overlap determination includes comparing a duration (i.e., width) of the comparative timing window from Net 1 (i.e., N1TE−N1LE) to the minimum separation (RTEMS). If (N1TE−N1LE) is greater than or equal to (RTEMS), an overlap condition exists. Otherwise, an overlap condition does not exist. As previously mentioned, the presence of an overlap condition may be indicative of an adverse crosstalk noise condition. Therefore, if an overlap condition is present, the two nets under consideration may be flagged for further evaluation and possible modification.

The forward analysis considers relationships between Net 1 and Net 2 timing windows in which the Net 1 timing window occurs at least as early as the Net 2 timing window. In a complementary manner, the reverse analysis considers relationships between Net 1 and Net 2 timing windows in which the Net 1 timing window occurs after the Net 2 timing window. Therefore, a forward analysis result indicating that a timing window overlap condition does not exist may be overturned by a reverse analysis result, vice-versa. In one embodiment a forward analysis result indicating that a timing window overlap condition exists may be sufficient without performing a reverse analysis, vice-versa. However, a forward analysis result indicating that a timing window overlap condition does not exist may prompt performance of a reverse analysis, vice-versa. It should be appreciated that the method of the present invention for performing a crosstalk noise analysis on a pair of nets to identify a timing window overlap presence between the nets can include one or both of the forward analysis and the reverse analysis, wherein either leading edges or trailing edges are considered.

The method of the present invention for evaluating nets in a crosstalk noise analysis can also be used to gauge an extent to which timing windows of a pair of nets overlap. For example, an extent of timing window overlap can be determined by comparing a timing window size to the minimum separation between timing windows of each net. With respect to the previous discussion, the extent of timing window overlap can be represented as ((N1TE−N1LE)−FLEMS), ((N2TE−N2LE)−FTEMS), ((N2TE−N2LE)−RLEMS), or ((N1TE−N1LE)−RTEMS). In one embodiment, a potential coupling between a pair of nets can be scaled by the extent of timing window overlap. This scaling can be used to prioritize the nets for further coupling analysis.

In one embodiment, the method of the present invention can be used to adjust an amount of coupling between nets based on an extent of timing window overlap between the nets. For example, the extent of timing window overlap can be used in combination with a slew rate of transitions associated with each net to determine an appropriate scaling of coupling capacitance. In another embodiment, the method of the present invention can be used to determine if a noise pulse would cause a glitch in a victim net that would be captured by a storage element (e.g., flip-flop, latch, . . . ) resulting in an incorrect state.

Figure 2:
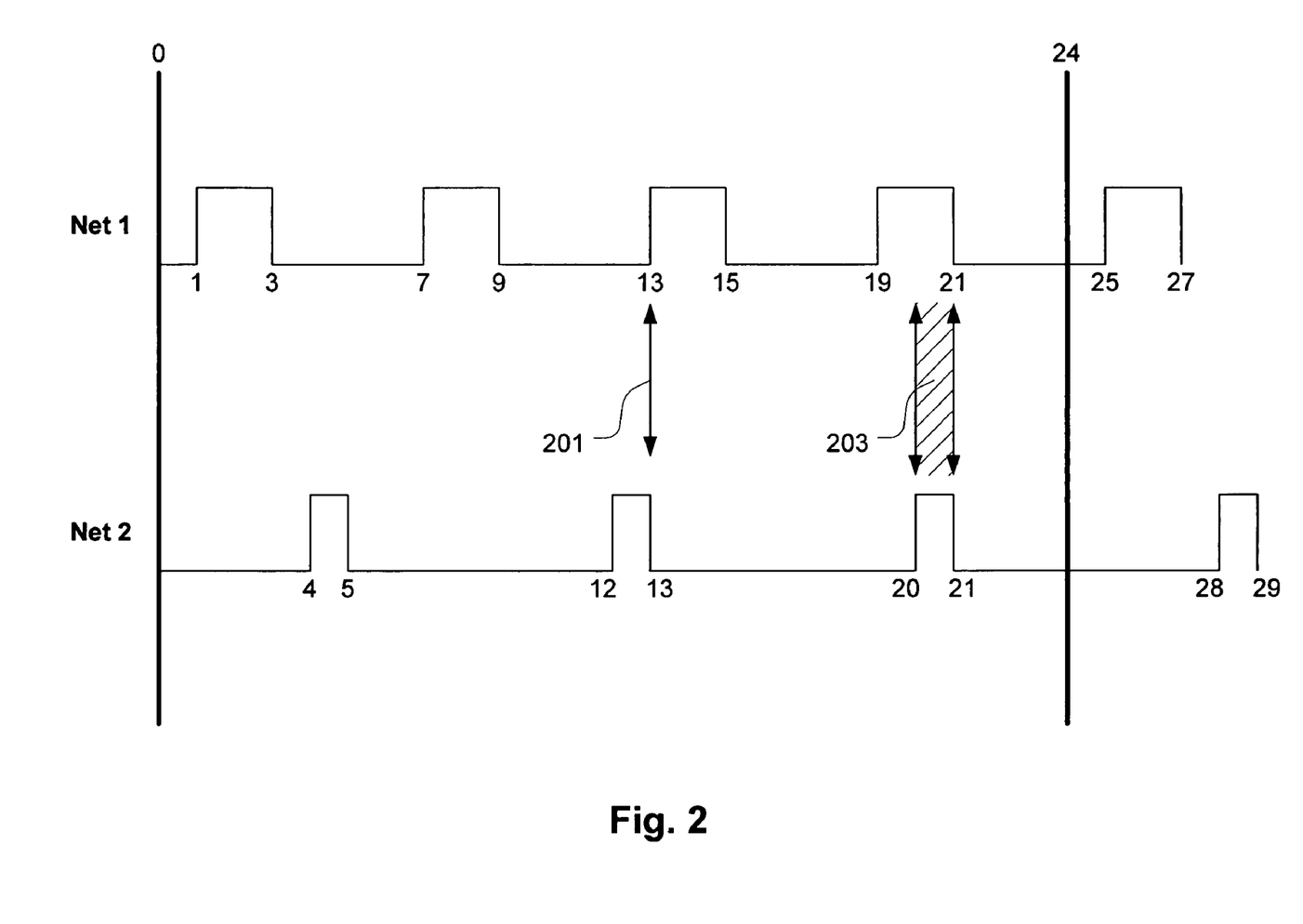
FIG. 2 is an illustration showing the timing window sequences of Net 1 and Net 2 corresponding to the example of Table 3.

A number of examples cases are discussed below to illustrate the method of the present invention. A first example in which both the forward analysis and the reverse analysis indicate an overlap presence is summarized in Table 3. FIG. 2 is an illustration showing the timing window sequences of Net 1 and Net 2 corresponding to the example of Table 3. Net 1 has a timing window sequence defined by a reference timing window [1,3] occurring at a period of 6. Net 2 has a timing window sequence defined by a reference timing window [4,5] occurring at a period of 8. The GCD of the Net 1 and Net 2 timing window sequence periods is 2. As presented in Table 3, each of the forward analysis using leading edges, the forward analysis using trailing edges, the reverse analysis using leading edges, and the reverse analysis using trailing edges indicates the presence of a timing window overlap. With respect to FIG. 2, the timing window overlap is represented by regions 201 and 203. It should be noted that the overlap region 201 only occurs at the timing window edges. A significance to be attributed to overlap at the timing window edges will be dependent on functional requirements of the nets under consideration.

Figure 3:
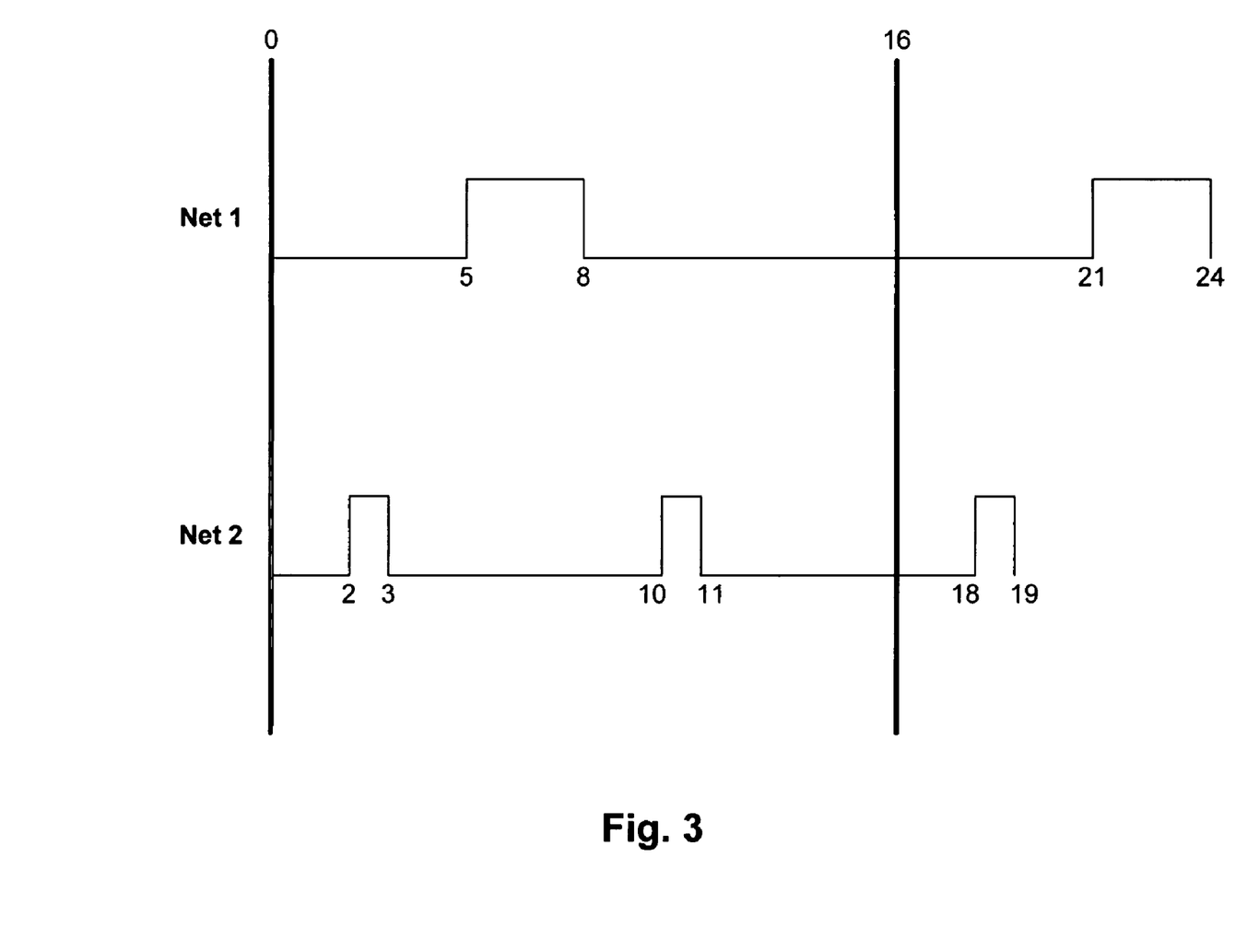
FIG. 3 is an illustration showing the timing window sequences of Net 1 and Net 2 corresponding to the example of Table 4.

A second example in which both the forward analysis and the reverse analysis do not indicate an overlap presence is summarized in Table 4. FIG. 3 is an illustration showing the timing window sequences of Net 1 and Net 2 corresponding to the example of Table 4. Net 1 has a timing window sequence defined by a reference timing window [5,8] occurring at a period of 16. Net 2 has a timing window sequence defined by a reference timing window [2,3] occurring at a period of 8. The GCD of the Net 1 and Net 2 timing window sequence periods is 8. As presented in Table 4, each of the forward analysis using leading edges, the forward analysis using trailing edges, the reverse analysis using leading edges, and the reverse analysis using trailing edges indicates that a timing window overlap does not exist. The absence of a timing window overlap is confirmed through observation of the timing windows presented in FIG. 3.

Figure 4:
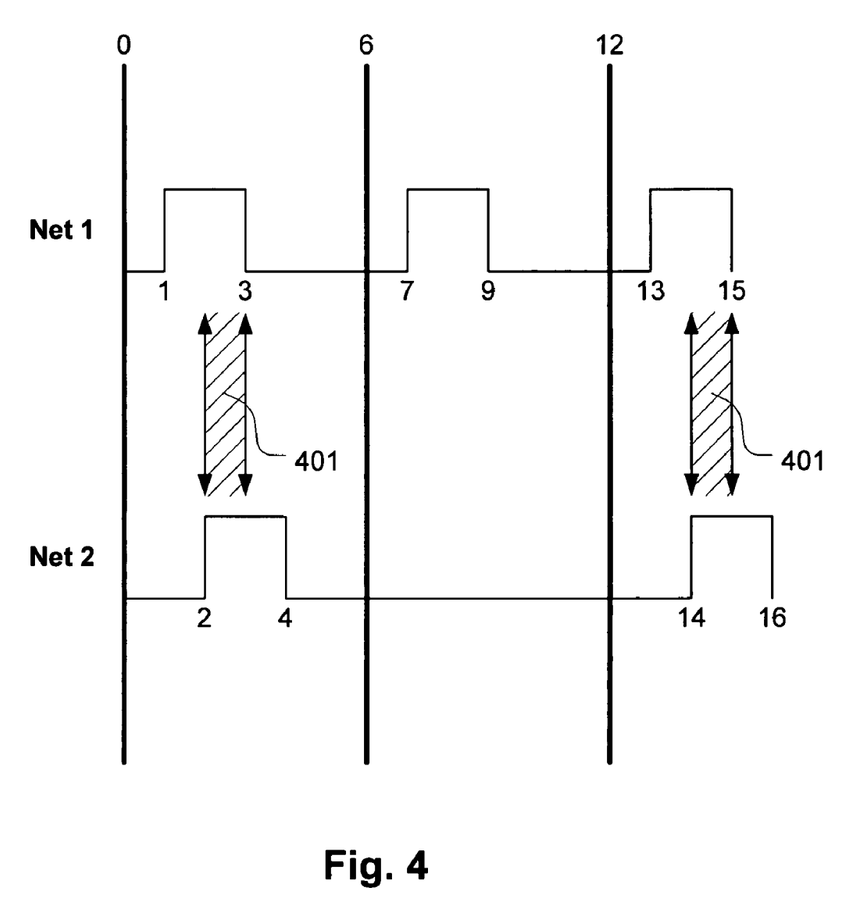
FIG. 4 is an illustration showing the timing window sequences of Net 1 and Net 2 corresponding to the example of Table 5.

A third example in which the forward analysis indicates a timing window overlap presence and the reverse analysis does not indicate a timing window overlap presence is summarized in Table 5. FIG. 4 is an illustration showing the timing window sequences of Net 1 and Net 2 corresponding to the example of Table 5. Net 1 has a timing window sequence defined by a reference timing window [1,3] occurring at a period of 6. Net 2 has a timing window sequence defined by a reference timing window [2,4] occurring at a period of 12. The GCD of the Net 1 and Net 2 timing window sequence periods is 6. As presented in Table 5, each of the forward analysis using leading edges and the forward analysis using trailing edges indicates a timing window overlap presence. However, each of the reverse analysis using leading edges and the reverse analysis using trailing edges does not indicate the presence of a timing window overlap. With respect to FIG. 4, the timing window overlap is represented by region 401.

Figure 5:
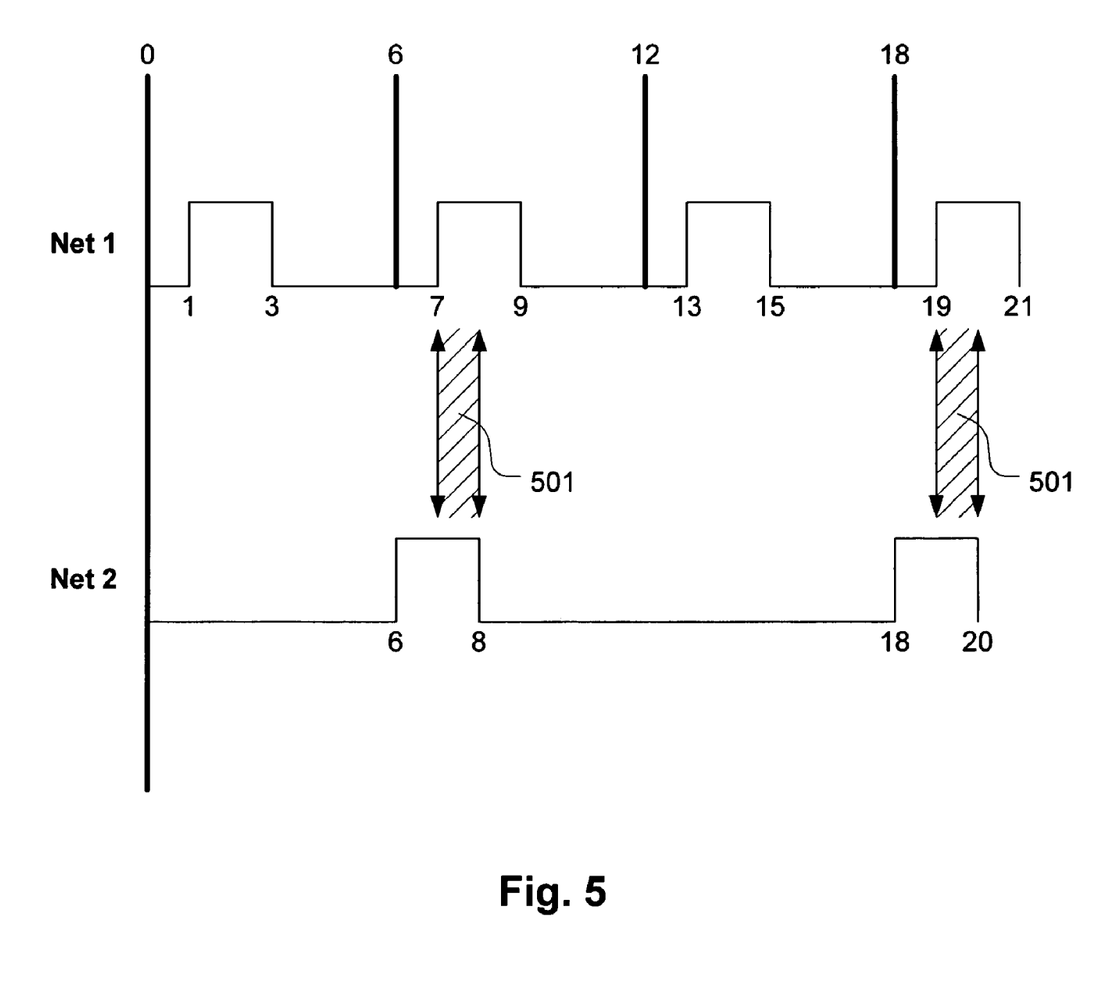
FIG. 5 is an illustration showing the timing window sequences of Net 1 and Net 2 corresponding to the example of Table 6.

A fourth example in which the forward analysis does not indicate a timing window overlap presence and the reverse analysis does indicate a timing window overlap presence is summarized in Table 6. FIG. 5 is an illustration showing the timing window sequences of Net 1 and Net 2 corresponding to the example of Table 6. Net 1 has a timing window sequence defined by a reference timing window [1,3] occurring at a period of 6. Net 2 has a timing window sequence defined by a reference timing window [6,8] occurring at a period of 12. The GCD of the Net 1 and Net 2 timing window sequence periods is 6. As presented in Table 6, each of the forward analysis using leading edges and the forward analysis using trailing edges does not indicate a timing window overlap presence. However, each of the reverse analysis using leading edges and the reverse analysis using trailing edges indicates the presence of a timing window overlap. With respect to FIG. 5, the timing window overlap is represented by region 501.

Figure 6:
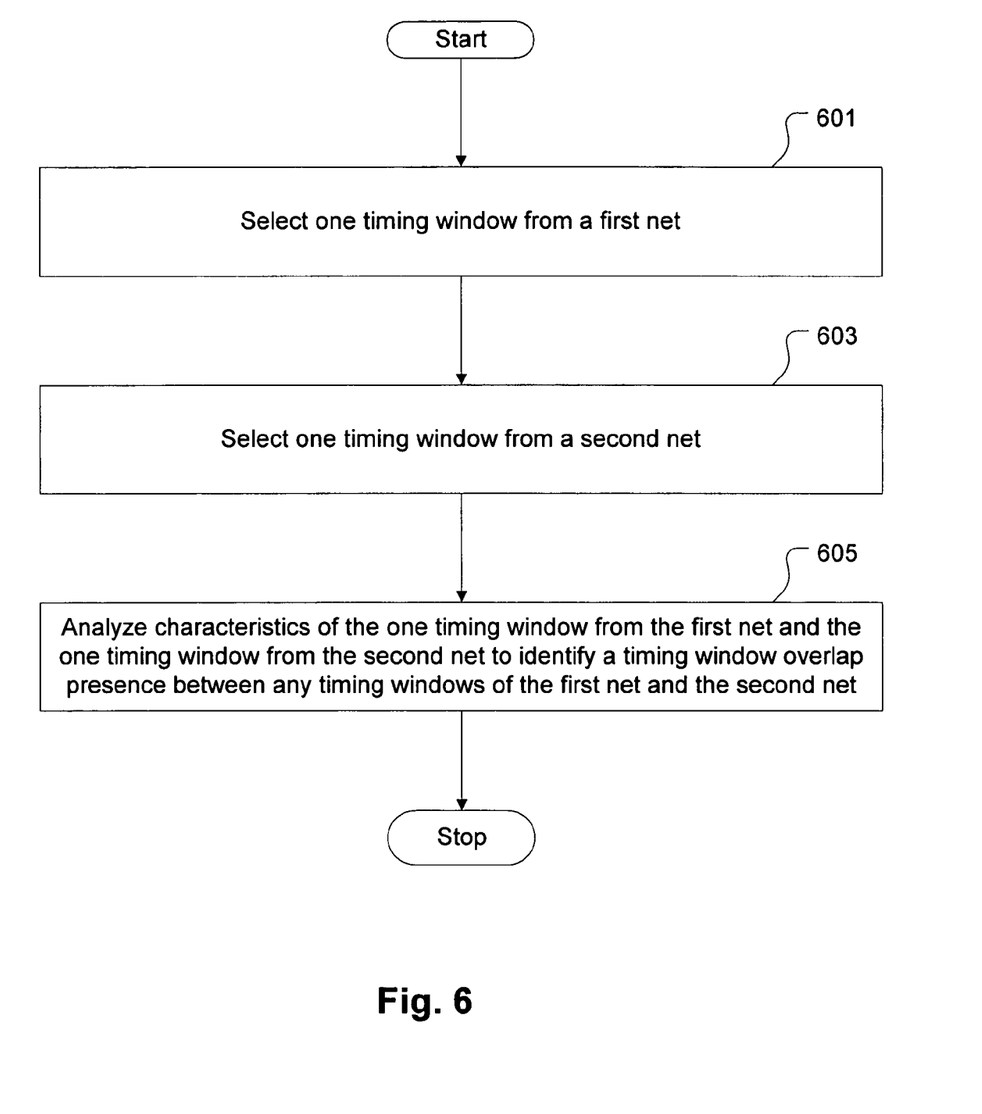
FIG. 6 is an illustration showing a flowchart of a method for evaluating nets in a crosstalk noise analysis, in accordance with one embodiment of the present invention.

FIG. 6 is an illustration showing a flowchart of a method for evaluating nets in a crosstalk noise analysis, in accordance with one embodiment of the present invention. It should be appreciated that the method described in accordance with FIG. 6 can be implemented in accordance with the operations previously described with respect to FIG. 1 and Tables 1 and 2. In the method of FIG. 6, an operation 601 is provided for selecting one timing window from a first net, wherein the first net includes a plurality of timing windows having a fixed period of occurrence. An operation 603 is also provided for selecting one timing window from a second net, wherein the second net includes a plurality of timing windows having a fixed period of occurrence. Each of the one timing window from the first net and the one timing window from the second net is respectively defined by a leading edge and a trailing edge, with a duration defined between the leading edge and the trailing edge.

The method of FIG. 6 further includes an operation 605 for analyzing characteristics of the one timing window from the first net and the one timing window from the second net to identify a timing window overlap presence. The timing window overlap presence can be between any of the plurality of timing windows associated with the first net and any of the plurality of timing windows associated with the second net. In one embodiment, the one timing window from the first net occurs at an instance in time that is at least as early as an instance in time at which the one timing window from second net occurs. This embodiment is analogous to the forward analysis comparative timing window requirements as previously described. In this embodiment, the analyzing considers relationships between timing windows of the first net and second net, wherein the timing windows of the first net occur at least as early as the timing windows of the second net. In another embodiment, the one timing window from the first net occurs later in time with respect to the one timing window from the second net. This embodiment is analogous to the reverse analysis comparative timing window requirements as previously described. In this embodiment, the analyzing considers relationships between timing windows of the first net and second net, wherein the timing windows of the first net occur later in time with respect to the timing windows of the second net. Additionally, in other embodiments, the method of FIG. 6 can include operations such as determining an extent of timing window overlap and prioritizing nets in terms of crosstalk noise potential based on the extent of timing window overlap.

Figure 7:
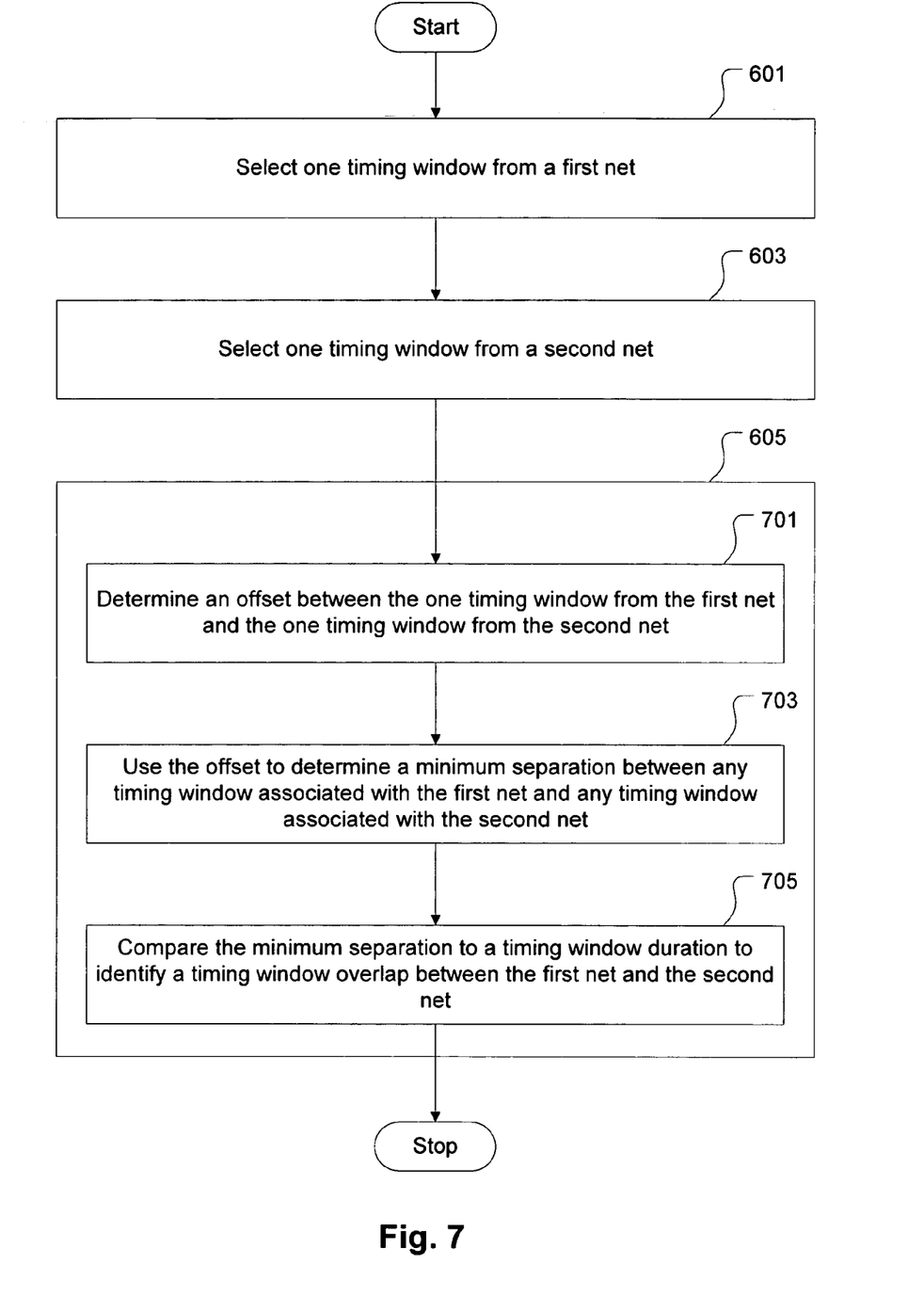
FIG. 7 is an illustration showing an expanded flowchart of the method for evaluating nets in a crosstalk noise analysis as described with respect to FIG. 6, in accordance with one embodiment of the present invention.

FIG. 7 is an illustration showing an expanded flowchart of the method for evaluating nets in a crosstalk noise analysis as described with respect to FIG. 6, in accordance with one embodiment of the present invention. More specifically, FIG. 7 shows an expanded representation of the operation 605 for analyzing characteristics of the one timing window from the first net and the one timing window from the second net to identify a timing window overlap presence. The operation 605 is shown to include operations 701, 703, and 705. In the operation 701, an offset is determined between the one timing window from the first net and the one timing window from the second net. In the operation 703, the offset from operation 701 is used to determine a minimum separation between any timing window associated with the first net and any timing window associated with the second net, wherein a relationship between the timing windows associated with the first net and the second net complies with the requirements of either the forward analysis or the reverse analysis. In the operation 705, the minimum separation from operation 703 is compared to a timing window duration to identify a timing window overlap between the first net and the second net. If the timing window duration is greater than or equal to the minimum separation, a timing window overlap between the first net and the second net exists. Otherwise, a timing window overlap between the first net and the second net does not exist.

It should be appreciated that the method of FIGS. 6 and 7 can include performing either the forward analysis, the reverse analysis, or both the forward and reverse analyses. For example, if it is necessary to simply identify the existence of a timing window overlap, the method may terminate upon identifying the presence of a timing window overlap in the first analysis performed, wherein the first analysis performed may be either the forward analysis or the reverse analysis. However, if the first analysis does not indicate the presence of a timing window overlap, it is necessary to perform a second analysis, wherein the second analysis is complementary to the first analysis. For example, if a forward analysis is first performed and does not indicate a timing window overlap, it is necessary to perform a reverse analysis to fully determine whether a timing window overlap truly does not exist, vice-versa.

With the above embodiments in mind, it should be understood that the present invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

TABLE 1

Summary of Timing Window Analysis Using Leading Edges

Net Specifications

| | |
|---|---|
| Net 1 Timing Window Sequence: | [min1,max1] at Period of P1 |
| Net 2 Timing Window Sequence: | [min2,max2] at Period of P2 |
| GCD of Net 1 and Net 2 Periods: | GCD |

TABLE 1-continued

Summary of Timing Window Analysis Using Leading Edges

Forward Analysis using Leading Edges
Comparative Timing Window Selection

| | |
|---|---|
| Net 1 Comparative Timing Window: | [N1LE,N1TE]<br>N1LE = (min1 + (m)(P1))<br>N1TE = (max1 + (m)(P1))<br>m is an integer value |
| Net 2 Comparative Timing Window: | [N2LE,N2TE]<br>N2LE = (min2 + (n)(P2))<br>N2TE = (max2 + (n)(P2))<br>n is an integer value<br>N1LE ≦ N2LE |

Minimum Separation Analysis

| | |
|---|---|
| Forward Analysis Leading Edge Offset (FLEOS): | (N2LE − N1LE) |
| Forward Analysis Leading Edge Minimum Separation (FLEMS): | (FLEOS % GCD) |

Overlap Determination

| | |
|---|---|
| Net 1 Comparative Timing Window Width (N1TE − N1LE) ≧ FLEMS? | TRUE → overlap<br>FALSE → no overlap |

Reverse Analysis using Leading Edges
Comparative Timing Window Selection

| | |
|---|---|
| Net 1 Comparative Timing Window: | [N1LE,N1TE]<br>N1LE = (min1 + (m)(P1))<br>N1TE = (max1 + (m)(P1))<br>m is an integer value |
| Net 2 Comparative Timing Window: | [N2LE,N2TE]<br>N2LE = (min2 + (n)(P2))<br>N2TE = (max2 + (n)(P2))<br>n is an integer value<br>N1LE > N2LE |

Minimum Separation Analysis

| | |
|---|---|
| Reverse Analysis Leading Edge Offset (RLEOS): | (N1LE − N2LE) |
| Reverse Analysis Leading Edge Minimum Separation (RLEMS): | (RLEOS % GCD) |

Overlap Determination

| | |
|---|---|
| Net 2 Comparative Timing Window Width (N2TE − N2LE) ≧ RLEMS? | TRUE → overlap<br>FALSE → no overlap |

TABLE 2

Summary of Timing Window Analysis Using Trailing Edges

Net Specifications

| | |
|---|---|
| Net 1 Timing Window Sequence: | [min1,max1] at Period of P1 |
| Net 2 Timing Window Sequence: | [min2,max2] at Period of P2 |
| GCD of Net 1 and Net 2 Periods: | GCD |

Forward Analysis using Trailing Edges
Comparative Timing Window Selection

| | |
|---|---|
| Net 1 Comparative Timing Window: | [N1LE,N1TE]<br>N1LE = (min1 + (m)(P1))<br>N1TE = (max1 + (m)(P1))<br>m is an integer value |
| Net 2 Comparative Timing Window: | [N2LE,N2TE]<br>N2LE = (min2 + (n)(P2))<br>N2TE = (max2 + (n)(P2))<br>n is an integer value<br>N1TE ≦ N2TE |

Minimum Separation Analysis

| | |
|---|---|
| Forward Analysis Trailing Edge Offset (FTEOS): | (N2TE − N1TE) |
| Forward Analysis Trailing Edge Minimum Separation (FTEMS): | (FTEOS % GCD) |

TABLE 2-continued

Summary of Timing Window Analysis Using Trailing Edges

Overlap Determination

| | |
|---|---|
| Net 2 Comparative Timing Window Width (N2TE − N2LE) ≥ FTEMS? | TRUE → overlap<br>FALSE → no overlap |

Reverse Analysis using Trailing Edges
Comparative Timing Window Selection

| | |
|---|---|
| Net 1 Comparative Timing Window: | [N1LE, N1TE]<br>N1LE = (min1 + (m)(P1))<br>N1TE = (max1 + (m)(P1))<br>m is an integer value |
| Net 2 Comparative Timing Window: | [N2LE, N2TE]<br>N2LE = (min2 + (n)(P2))<br>N2TE = (max2 + (n)(P2))<br>n is an integer value<br>N1TE > N2TE |

Minimum Separation Analysis

| | |
|---|---|
| Reverse Analysis Trailing Edge Offset (RTEOS): | (N1TE − N2TE) |
| Reverse Analysis Trailing Edge Minimum Separation (RTEMS): | (RTEOS % GCD) |

Overlap Determination

| | |
|---|---|
| Net 1 Comparative Timing Window Width (N1TE − N1LE) ≥ RTEMS? | TRUE → overlap<br>FALSE → no overlap |

TABLE 3

Timing Window Overlap Analysis Example 1

Net Specifications

| | |
|---|---|
| Net 1 Timing Window Sequence: | [1,3] at Period of 6 |
| Net 2 Timing Window Sequence: | [4,5] at Period of 8 |
| GCD of Net 1 and Net 2 Periods: | 2 |

Forward Analysis using Leading Edges
Comparative Timing Window Selection

| | |
|---|---|
| Net 1 Comparative Timing Window: | [7,9] |
| Net 2 Comparative Timing Window: | [12,13] |

Minimum Separation Analysis

| | |
|---|---|
| FLEOS: | 5 |
| FLEMS: | 1 |

Overlap Determination

| | |
|---|---|
| (N1TE − N1LE) ≥ FLEMS? | TRUE → overlap |

Reverse Analysis using Leading Edges
Comparative Timing Window Selection

| | |
|---|---|
| Net 1 Comparative Timing Window: | [13,15] |
| Net 2 Comparative Timing Window: | [12,13] |

Minimum Separation Analysis

| | |
|---|---|
| RLEOS: | 1 |
| RLEMS: | 1 |

Overlap Determination

| | |
|---|---|
| (N2TE − N2LE) ≥ RLEMS? | TRUE → overlap |

Forward Analysis using Trailing Edges
Comparative Timing Window Selection

| | |
|---|---|
| Net 1 Comparative Timing Window: | [7,9] |
| Net 2 Comparative Timing Window: | [12,13] |

Minimum Separation Analysis

| | |
|---|---|
| FTEOS: | 4 |
| FTEMS: | 0 |

Overlap Determination

| | |
|---|---|
| (N2TE − N2LE) ≥ FTEMS? | TRUE → overlap |

TABLE 3-continued

Timing Window Overlap Analysis Example 1

Reverse Analysis using Trailing Edges
Comparative Timing Window Selection

| | |
|---|---|
| Net 1 Comparative Timing Window: | [13,15] |
| Net 2 Comparative Timing Window: | [12,13] |

Minimum Separation Analysis

| | |
|---|---|
| RTEOS: | 2 |
| RTEMS: | 0 |

Overlap Determination

| | |
|---|---|
| (N1TE − N1LE) ≥ RTEMS? | TRUE → overlap |

TABLE 4

Timing Window Overlap Analysis Example 2

Net Specifications

| | |
|---|---|
| Net 1 Timing Window Sequence: | [5,8] at Period of 16 |
| Net 2 Timing Window Sequence: | [2,3] at Period of 8 |
| GCD of Net 1 and Net 2 Periods: | 8 |

Forward Analysis using Leading Edges
Comparative Timing Window Selection

| | |
|---|---|
| Net 1 Comparative Timing Window: | [5,8] |
| Net 2 Comparative Timing Window: | [10,11] |

Minimum Separation Analysis

| | |
|---|---|
| FLEOS: | 5 |
| FLEMS: | 5 |

Overlap Determination

| | |
|---|---|
| (N1TE − N1LE) ≥ FLEMS? | FALSE → no overlap |

Reverse Analysis using Leading Edges
Comparative Timing Window Selection

| | |
|---|---|
| Net 1 Comparative Timing Window: | [5,8] |
| Net 2 Comparative Timing Window: | [2,3] |

Minimum Separation Analysis

| | |
|---|---|
| RLEOS: | 3 |
| RLEMS: | 3 |

Overlap Determination

| | |
|---|---|
| (N2TE − N2LE) ≥ RLEMS? | FALSE → no overlap |

Forward Analysis using Trailing Edges
Comparative Timing Window Selection

| | |
|---|---|
| Net 1 Comparative Timing Window: | [5,8] |
| Net 2 Comparative Timing Window: | [10,11] |

Minimum Separation Analysis

| | |
|---|---|
| FTEOS: | 3 |
| FTEMS: | 3 |

Overlap Determination

| | |
|---|---|
| (N2TE − N2LE) ≥ FTEMS? | FALSE → no overlap |

Reverse Analysis using Trailing Edges
Comparative Timing Window Selection

| | |
|---|---|
| Net 1 Comparative Timing Window: | [5,8] |
| Net 2 Comparative Timing Window: | [2,3] |

Minimum Separation Analysis

| | |
|---|---|
| RTEOS: | 5 |
| RTEMS: | 5 |

Overlap Determination

| | |
|---|---|
| (N1TE − N1LE) ≥ RTEMS? | FALSE → no overlap |

TABLE 5

Timing Window Overlap Analysis Example 3

Net Specifications

| | |
|---|---|
| Net 1 Timing Window Sequence: | [1,3] at Period of 6 |
| Net 2 Timing Window Sequence: | [2,4] at Period of 12 |
| GCD of Net 1 and Net 2 Periods: | 6 |

Forward Analysis using Leading Edges
Comparative Timing Window Selection

| | |
|---|---|
| Net 1 Comparative Timing Window: | [1,3] |
| Net 2 Comparative Timing Window: | [2,4] |

Minimum Separation Analysis

| | |
|---|---|
| FLEOS: | 1 |
| FLEMS: | 1 |

Overlap Determination

| | |
|---|---|
| (N1TE − N1LE) ≧ FLEMS? | TRUE → overlap |

Reverse Analysis using Leading Edges
Comparative Timing Window Selection

| | |
|---|---|
| Net 1 Comparative Timing Window: | [7,9] |
| Net 2 Comparative Timing Window: | [2,4] |

Minimum Separation Analysis

| | |
|---|---|
| RLEOS: | 5 |
| RLEMS: | 5 |

Overlap Determination

| | |
|---|---|
| (N2TE − N2LE) ≧ RLEMS? | FALSE → no overlap |

Forward Analysis using Trailing Edges
Comparative Timing Window Selection

| | |
|---|---|
| Net 1 Comparative Timing Window: | [1,3] |
| Net 2 Comparative Timing Window: | [2,4] |

Minimum Separation Analysis

| | |
|---|---|
| FTEOS: | 1 |
| FTEMS: | 1 |

Overlap Determination

| | |
|---|---|
| (N2TE − N2LE) ≧ FTEMS? | TRUE → overlap |

Reverse Analysis using Trailing Edges
Comparative Timing Window Selection

| | |
|---|---|
| Net 1 Comparative Timing Window: | [7,9] |
| Net 2 Comparative Timing Window: | [2,4] |

Minimum Separation Analysis

| | |
|---|---|
| RTEOS: | 5 |
| RTEMS: | 5 |

Overlap Determination

| | |
|---|---|
| (N1TE − N1LE) ≧ RTEMS? | FALSE → no overlap |

TABLE 6

Timing Window Overlap Analysis Example 4

Net Specifications

| | |
|---|---|
| Net 1 Timing Window Sequence: | [1,3] at Period of 6 |
| Net 2 Timing Window Sequence: | [6,8] at Period of 12 |
| GCD of Net 1 and Net 2 Periods: | 6 |

Forward Analysis using Leading Edges
Comparative Timing Window Selection

| | |
|---|---|
| Net 1 Comparative Timing Window: | [1,3] |
| Net 2 Comparative Timing Window: | [6,8] |

Minimum Separation Analysis

| | |
|---|---|
| FLEOS: | 5 |
| FLEMS: | 5 |

TABLE 6-continued

Timing Window Overlap Analysis Example 4

Overlap Determination

| | |
|---|---|
| (N1TE − N1LE) ≧ FLEMS? | FALSE → no overlap |

Reverse Analysis using Leading Edges
Comparative Timing Window Selection

| | |
|---|---|
| Net 1 Comparative Timing Window: | [7,9] |
| Net 2 Comparative Timing Window: | [6,8] |

Minimum Separation Analysis

| | |
|---|---|
| RLEOS: | 1 |
| RLEMS: | 1 |

Overlap Determination

| | |
|---|---|
| (N2TE − N2LE) ≧ RLEMS? | TRUE → overlap |

Forward Analysis using Trailing Edges
Comparative Timing Window Selection

| | |
|---|---|
| Net 1 Comparative Timing Window: | [1,3] |
| Net 2 Comparative Timing Window: | [6,8] |

Minimum Separation Analysis

| | |
|---|---|
| FTEOS: | 5 |
| FTEMS: | 5 |

Overlap Determination

| | |
|---|---|
| (N2TE − N2LE) ≧ FTEMS? | FALSE → no overlap |

Reverse Analysis using Trailing Edges
Comparative Timing Window Selection

| | |
|---|---|
| Net 1 Comparative Timing Window: | [7,9] |
| Net 2 Comparative Timing Window: | [6,8] |

Minimum Separation Analysis

| | |
|---|---|
| RTEOS: | 1 |
| RTEMS: | 1 |

Overlap Determination

| | |
|---|---|
| (N1TE − N1LE) ≧ RTEMS? | TRUE → overlap |

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for evaluating nets in a crosstalk noise analysis, comprising:
    selecting one timing window from a first net, wherein the first net includes a plurality of timing windows;
    selecting one timing window from a second net, wherein the second net includes a plurality of timing windows;
    analyzing characteristics of the one timing window from the first net and the one timing window from the second net to identify a timing window overlap presence between any of the plurality of timing windows associated with the first net and any of the plurality of timing windows associated with the second net, wherein the analyzing includes
    determining an offset if present between the one timing window from the first net and the one timing window from the second net,
    obtaining a remainder of an integer division between the offset and a greatest common divisor of periods of the first and second nets, and comparing the remainder to a duration of one of the timing windows selected from one of the first net and the second net; and flagging the first and second nets as having a potentially adverse crosstalk noise condition upon identification of the timing window overlap presence.

2. The method for evaluating nets in a crosstalk noise analysis as recited in claim 1, wherein each of the one timing window from the first net and the one timing window from the second net is respectively defined by a leading edge and a trailing edge with a duration defined between the leading edge and the trailing edge.

3. The method for evaluating nets in a crosstalk noise analysis as recited in claim 1, further comprising:

determining an extent of timing window overlap upon identifying the timing window overlap presence.

4. The method for evaluating nets in a crosstalk noise analysis as recited in claim 3, further comprising:

prioritizing the first net and the second net in terms of an adverse crosstalk noise potential based on the extent of timing window overlap.

5. The method for evaluating nets in a crosstalk noise analysis as recited in claim 1, wherein the one timing window from the first net occurs at a first instance and the one timing window from the second net occurs at a second instance, the first instance being at least as early in time as the second instance, and wherein the analyzing identifies a timing window overlap presence between any timing window associated with the first net occurring at least as early in time as a particular timing window associated with the second net, wherein the particular timing window associated with the second net can be any timing window associated with the second net.

6. The method for evaluating nets in a crosstalk noise analysis as recited in claim 5, wherein each of the first instance and the second instance is defined by a leading edge of the corresponding timing window, and wherein an occurrence of a timing window associated with either the first net or the second net is defined by a leading edge of the timing window.

7. The method for evaluating nets in a crosstalk noise analysis as recited in claim 6, wherein the analyzing includes, determining an offset between a leading edge of the one timing window from the first net relative to a leading edge of the one timing window from the second net, using the offset to determine a minimum separation between a leading edge of any timing window associated with the first net and a leading edge of any timing window associated with the second net, and comparing the minimum separation to a duration of the one timing window from the first net, wherein the duration of the one timing window from the first net being at least as large as the minimum separation indicates a timing window overlap presence between the first net and the second net.

8. The method for evaluating nets in a crosstalk noise analysis as recited in claim 7, wherein using the offset to determine a minimum separation between a leading edge of any timing window associated with the first net and a leading edge of any timing window associated with the second net includes, determining a remainder of an integer division operation in which the offset is divided by a denominator, the denominator being defined as a greatest common divisor between a period of a timing window sequence associated with the first net and a period of a timing window sequence associated with the second net, wherein the remainder represents the minimum separation.

9. The method for evaluating nets in a crosstalk noise analysis as recited in claim 1, wherein the one timing window from the first net occurs at a first instance and the one timing window from the second net occurs at a second instance, the first instance occurring later in time than the second instance, and wherein the analyzing identifies a timing window overlap presence between any timing window associated with the first net occurring later in time than a particular timing window associated with the second net, wherein the particular timing window associated with the second net can be any timing window associated with the second net.

10. The method for evaluating nets in a crosstalk noise analysis as recited in claim 9, wherein each of the first instance and the second instance is defined by a leading edge of the corresponding timing window, and wherein an occurrence of a timing window associated with either the first net or the second net is defined by a leading edge of the timing window.

11. The method for evaluating nets in a crosstalk noise analysis as recited in claim 10, wherein the analyzing includes, determining an offset between a leading edge of the one timing window from the second net relative to a leading edge of the one timing window from the first net, using the offset to determine a minimum separation between a leading edge of any timing window associated with the second net and a leading edge of any timing window associated with the first net, and comparing the minimum separation to a duration of the one timing window from the second net, wherein the duration of the one timing window from the second net being at least as large as the minimum separation indicates a timing window overlap presence between the first net and the second net.

12. The method for evaluating nets in a crosstalk noise analysis as recited in claim 11, wherein using the offset to determine a minimum separation between a leading edge of any timing window associated with the second net and a leading edge of any timing window associated with the first net includes, determining a remainder of an integer division operation in which the offset is divided by a denominator, the denominator being defined as a greatest common divisor between a period of a timing window sequence associated with the first net and a period of a timing window sequence associated with the second net, wherein the remainder represents the minimum separation.

13. A computer readable medium containing program instructions for evaluating nets in a crosstalk noise analysis, comprising:

program instructions for selecting one timing window from a first net, wherein the first net includes a plurality of timing windows;

program instructions for selecting one timing window from a second net, wherein the second net includes a plurality of timing windows;

program instructions for analyzing characteristics of the one timing window from the first net and the one timing window from the second net to identify a timing window overlap presence between any of the plurality of timing windows associated with the first net and any of the plurality of timing windows associated with the second net, wherein the program instructions for analyzing includes program instructions for determining an offset if present between the one timing window from the first net and the one timing window from the second net, program instructions for obtaining a remainder of an integer division between the offset and a greatest common divisor of periods of the first and second nets, and program instructions for comparing the remainder to a duration of one of the timing windows selected from one of the first net and the second net; and program instructions for flagging the first and second nets as having a potentially adverse crosstalk noise condition upon identification of the timing window overlap presence.

14. The computer readable medium containing program instructions for evaluating nets in a crosstalk noise analysis as recited in claim 13, further comprising:

program instructions for determining an extent of timing window overlap upon identifying the timing window overlap presence.

15. The computer readable medium containing program instructions for evaluating nets in a crosstalk noise analysis as recited in claim 14, further comprising:

program instructions for prioritizing the first net and the second net in terms of an adverse crosstalk noise potential based on the extent of timing window overlap.

16. A method for evaluating timing window overlap between a pair of nets, comprising:

selecting one timing window from a first net;

selecting one timing window from a second net, wherein the selected timing window from the second net occurs at about a same time or at a later time relative to the selected timing window from the first net;

analyzing the selected timing windows from the first net and the second net to identify a presence of a timing window overlap between any timing window of the first net occurring at about a same time or at a later time relative to a particular timing window of the second net, wherein the particular timing window of the second net can be any timing window of the second net, wherein the analyzing includes determining an offset if present between the one timing window from the first net and the one timing window from the second net, obtaining a remainder of an integer division between the offset and a greatest common divisor of periods of the first and second nets, and comparing the remainder to a duration of one of the timing windows selected from one of the first net and the second net; and flagging the first and second nets as having a potentially adverse crosstalk noise condition upon identification of the timing window overlap presence.

17. A method for evaluating timing window overlap between a pair of nets, comprising:

selecting one timing window from a first net;

selecting one timing window from a second net, wherein the selected timing window from the second net occurs prior in time to the selected timing window from the first net;

analyzing the selected timing windows from the first net and the second net to identify a presence of a timing window overlap between any timing window of the first net occurring later in time than a particular timing window of the second net, wherein the particular timing window of the second net can be any timing window of the second net, wherein the analyzing includes determining an offset if present between the one timing window from the first net and the one timing window from the second net, obtaining a remainder of an integer division between the offset and a greatest common divisor of periods of the first and second nets, and comparing the remainder to a duration of one of the timing windows selected from one of the first net and the second net; and flagging the first and second nets as having a potentially adverse crosstalk noise condition upon identification of the timing window overlap presence.

* * * * *